United States Patent
Kim et al.

(10) Patent No.: US 6,460,159 B1
(45) Date of Patent: Oct. 1, 2002

(54) DEVICE AND METHOD FOR CONVOLUTIONAL ENCODING IN DIGITAL SYSTEM

(75) Inventors: Min-Goo Kim, Suwon-shi; Beong-Jo Kim; Young-Hwan Lee, both of Songnam-shi; Soon-Jae Choi, Songnam-shi, all of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/476,436

(22) Filed: Dec. 30, 1999

(30) Foreign Application Priority Data

Dec. 31, 1998 (KR) .......................... 1998-62708

(51) Int. Cl.⁷ .............................. H03M 13/23
(52) U.S. Cl. ..................................... 714/790
(58) Field of Search ................... 714/786, 790

(56) References Cited

U.S. PATENT DOCUMENTS

| | | | |
|---|---|---|---|
| 6,101,626 A | * 8/2000 | Morelos-Zaragoza et al. | 714/786 |
| 6,134,696 A | * 10/2000 | Morelos-Zaragoza et al. | 375/262 |
| 6,170,076 B1 | * 1/2001 | Kim | 714/756 |
| 6,347,122 B1 | * 2/2002 | Chen et al. | 375/219 |

FOREIGN PATENT DOCUMENTS

| | | |
|---|---|---|
| EP | 0 682 415 A | 11/1995 |
| WO | WO 9623360 A | 8/1996 |
| WO | WO 9750218 A | 12/1997 |

OTHER PUBLICATIONS

Lin et al., Error Control Coding, Prentice–Hall Pub. 1983, pp. 329–349.*

Michelson et al., "A Severely Punctured Convolutional Code Its Performance and Structure", *Milcom* '91, pp. 1007–1012.*

Lee, "New Rate–Compatible Punctured Convlutional Codes for Viterbi Decoding", IEEE Transactions on Communications, vol. 42, No. 12, Dec. 1994, pp. 3073–3079.*

Hagenauer: "Rate–Compatible Punctured Convolutional Codes and Their Applications", IEEE on Communications, vol. 36, No. 4—Apr. 1988, p. 390, line 22—p. 391, line 42.

Bian et al.: "New very high rate punctured convolutional codes", Electronics Letters, vol. 30, No. 14, pp. 1119–1120.

* cited by examiner

*Primary Examiner*—Stephen M. Baker
(74) *Attorney, Agent, or Firm*—Dilworth & Barrese, LLP

(57) ABSTRACT

A convolutional encoding device and method in a digital system. According to an embodiment of the present invention, a convolutional encoding device has a convolutional encoder and a puncturer. The convolutional encoder generates a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$, for inputting input bits to generate a symbol group of three subgroups for three successive input bits, and for generating a stream of the symbol groups. A symbol puncturer punctures the first symbol of one of three subgroups in each symbol group generated from the convolutional encoder.

12 Claims, 3 Drawing Sheets

DEVICE AND METHOD FOR CONVOLUTIONAL ENCODING IN DIGITAL SYSTEM

BACKGROUND OF THE INVENTION

1. Field of the Invention

The present invention relates generally to an error correction code, and in particular, to a device and method for convolutional encoding in a digital system. The present invention also pertains to a device and method for convolutional encoding in a radio communication system such as a satellite system, a digital cellular system, a W-CDMA system, and an IMT-2000 system.

2. Description of the Related Art

A convolutional code with a code rate $R=\frac{1}{2}$, 1/3, or ¼ is typically used to correct errors in transmitted or recorded data in a communication system or data transmission/recording systems.

Puncturing can be used for a CDMA (Code Division Multiple Access) communication system to generate a new convolutional code with a higher code rate from a convolutional code with $R=\frac{1}{n}$. Puncturing is performed because the decoding complexity of a Viterbi decoder for $R=k/n$ convolutional codes in a receiver increases exponentially as k increase. When an $R=k/n (k>1)$ convolutional code is used to produce a high rate convolutional code, the number of branches merged and departed in each state increases exponentially in a trellis of a Viterbi decoder. To reduce such decoding complexity, puncturing is used on the convolutional code having a code rate of $R=\frac{1}{n}$. The decoding complexity involved in the puncturing is almost the same as that of the convolutional code with $R=\frac{1}{n}$. The convolutional code puncturing technique provides error correction and increases the reliability of a digital communication system. This is a technical field which can improve the performance of future communication systems.

CDMA has evolved from the IS-95 standard which focused only on the transmission/reception of a voice signal to the IMT-2000 standard which provides the additional services of the transmission of high quality voice and moving pictures and Internet browsing.

Convolutional codes are expected to be used as forward error correction codes for a control channel, a voice channel, and a data transmission channel in the air interface of an IMT-2000 system. They are also considered as candidates for error correction of the air interface of a universal mobile telecommunications system (UMTS) developed by European Telecommunications Standards Institute (ETSI).

The proposed IMT-2000 standard recommends that convolutional codes be used as an error correction code for the control channel, voice channel, and data transmission channel in the air interface. However, the CDMA-2000 specification is not a final version and many details remain to be determined. In particular, problems with a puncturing pattern used for rate matching on a logical channel that is convolutionally encoded remain.

FIG. 1A illustrates the forward link structure of a forward supplemental channel among logical channels as provided by the CDMA 2000 specification.

Referring to FIG. 1A, a CRC (Cyclic Redundancy Check) generator 105 adds CRC data to corresponding received data (264 to 9192 bits) of different bit rates. A tail bit generator 110 adds corresponding tail bits to the output of the CRC generator 105. If an encoder 115 is a convolutional encoder with a constraint length k=9, the tail bit generator 110 adds 8 tail bits, and if it is a turbo encoder with k=4 and two component encoders, the tail bit generator 110 adds 6 tail bits and 2 reserved bits (RVBs).

The encoder 115 encodes bit data received from the tail bit generator 110 and outputs corresponding code symbols. The encoder 115 can be a convolutional encoder or a turbo encoder as stated above. In the case of the convolutional encoder, the encoder 115 has a constraint length k=9 and $R=\frac{3}{8}$. The turbo encoder is not a main interest in the present invention and thus its description will be omitted. A block interleaver 120 receives the data from encoder 115 and interleaves the data.

The CDMA 2000 specification provides that a puncturer should delete every ninth symbol of an output sequence from a convolutional encoder with k=9 and $R=\frac{1}{3}$, in order to implement the convolutional encoder 115 with k=9 and $R=\frac{3}{8}$.

FIG. 1B is a block diagram of a convolutional encoder for a forward supplemental channel according to the CDMA 2000 specification.

Referring to FIG. 1B, in the case that the encoder 115 of FIG. 1A is a convolutional encoder 125, the convolutional encoder 125 is composed of a convolutional encoder 130 with k=9 and $R=\frac{1}{3}$ for encoding input data and outputting corresponding symbols and a puncturer 135 for puncturing every ninth symbol of a encoded sequence received from the convolutional encoder 130.

FIG. 2 illustrates the structure of convolutional encoder 130 with k=9 and $R=\frac{1}{3}$ shown in FIG. 1B.

In FIG. 2, reference number 310 denotes shift registers and reference numbers 31a, 31b, and 31c denote modulo-2 adders coupled to their respective shift registers. Generator polynomials for the convolutional encoder 130 are $$g_0(x)=1+x^2+x^3+x^5+x^6+x^7+x^8$$
$$g_1(x)=1+x+x^3+x^4+x^7+x^8$$
$$g_2(x)=1+x+x^2+x^5+x^8 \quad (1)$$

The convolutional encoder 130 generates three code symbols ($C_0$, $C_1$, $C_2$) for each input information bit.

Meanwhile, the puncturer 135 punctures the last ninth symbol of code symbols received from the convolutional encoder 130 according to a puncturing pattern based on the CDMA 2000 specification. If the puncturing matrix is P, then the current puncturing pattern would be P={111 111 110}. From P={111 111 110}, three code symbols for one input bit form one subgroup and three subgroups for three successive input bits form one symbol group. The conventional puncturing pattern P={111 111 110} represents puncturing the last symbol in the third subgroup. This puncturing pattern exhibits the same performance as that of a puncturing pattern P={111 110 111} or P={110111111}.

However, it cannot be said that the above puncturing technique is optimal because other puncturing patterns may be better in terms of the weight spectrum and decoded symbol error probability of encoded symbols.

SUMMARY OF THE INVENTION

It is, therefore, an object of the present invention to provide a convolutional encoding device in a digital system which encodes input bits with a constraint length of 9, a code rate of ⅓, and a predetermined generator polynomial, and punctures corresponding symbols of the encoded symbols according to a new puncturing pattern having an improved performance relative to the conventional puncturing pattern.

It is another object of the present invention to provide a convolutional encoding device for encoding bits received on a CDMA 2000 forward supplemental channel and for puncturing corresponding symbols of the encoded symbols according to a new puncturing pattern having an improved performance relative to the conventional puncturing pattern.

It is a further object of the present invention to provide a CDMA 2000 forward supplemental channel transmitter for encoding bits transmitted on a CDMA 2000 forward supplemental channel and for puncturing corresponding symbols of the encoded symbols according to a new puncturing pattern having an improved performance relative to the conventional puncturing pattern.

These and other objects are achieved by providing a convolutional encoding device having a convolutional encoder and a puncturer. The convolutional encoder convolutionally encodes input bits with a constraint length of 9, a code rate of ⅓, and generator polynomials $g_0(x)=1+x^2+x^3+x^5+x^6+x^7+x^8$, $g_1(x)=1+x+x^3+x^4+x^7+x^8$, and $g_2(x)=1+x+x^2+x^5+x^8$ and outputs a subgroup of three encoded symbols for each input bit and a symbol group of three subgroups for three successive input bits. The puncturer punctures the first symbol of one subgroup in each symbol group received from the convolutional encoder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Figure 1A:
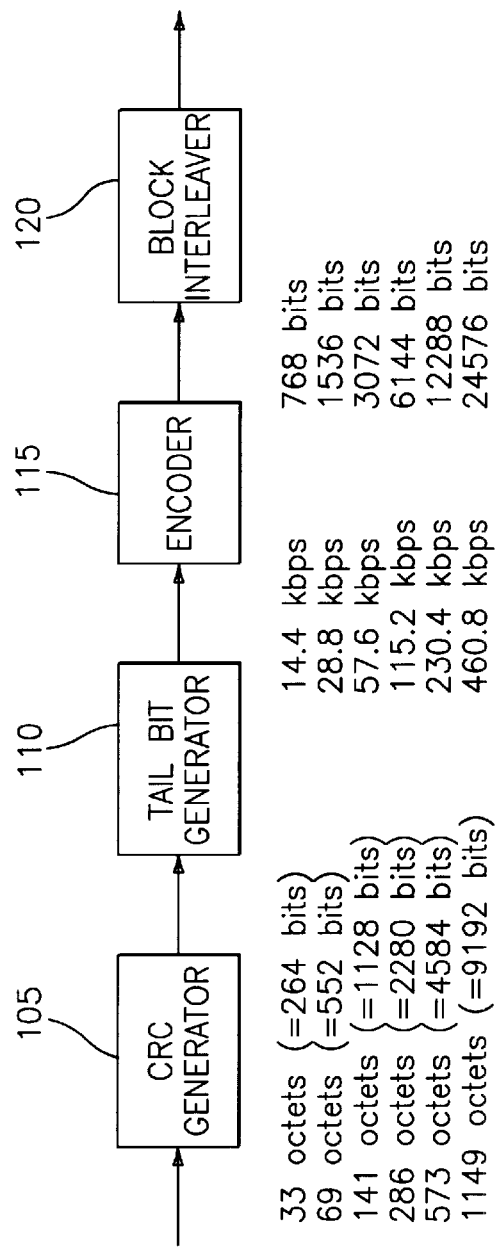
FIG. 1A illustrates the forward link structure of a forward supplemental channel among CDMA logical channels.
Figure 1B:
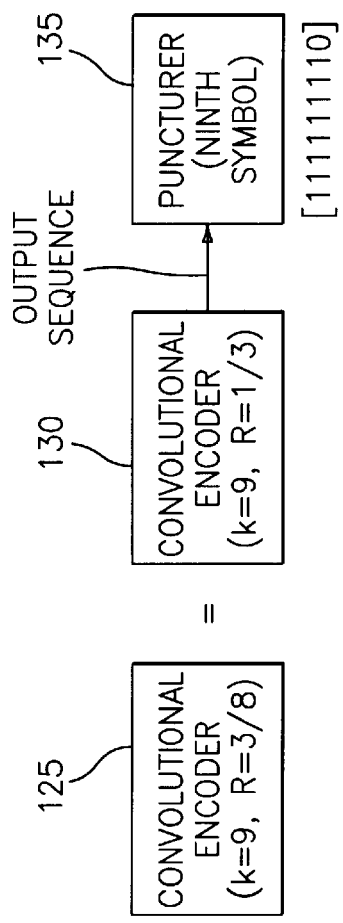
FIG. 1B illustrates the structure of a convolutional encoder for the CDMA 2000 supplemental channel.
Figure 2:
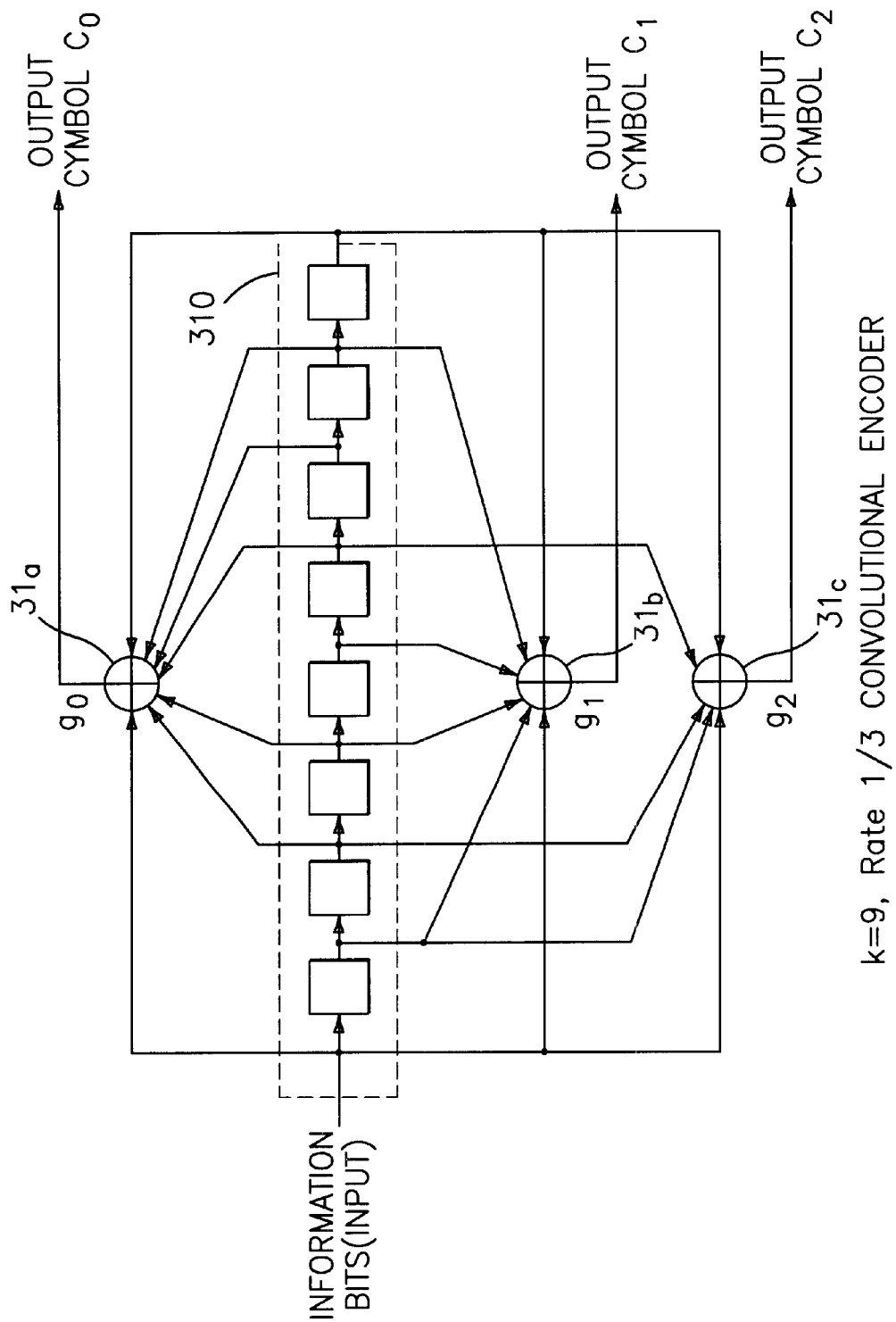
FIG. 2 illustrates the structure of a convolutional encoder with a constraint length of 9 and a code rate of ⅓ for the CDMA supplemental channel.

Preferred embodiments of the present invention will be described hereinbelow with reference to the accompanying drawings. In the following description, well-known functions or constructions are not described in detail since they would obscure the invention in unnecessary detail.

The present invention provides a new puncturing pattern for a CDMA 2000 supplemental channel, which exhibits better performance over the conventional puncturing pattern. The improved performance of the new puncturing pattern is shown by comparing the performances of the new and conventional puncturing patterns in a simulation.

A puncturing matrix is generally expressed as $$P=\{111111110\} \quad (2)$$

where '1' represents symbol transmission and '0' represents symbol puncturing.

For example, with R=½, a puncturing period=9, and P={1111 1111 0}, punctured code symbols corresponding to original code symbols (C11, C12, C21, C22, C31, C32, C41, C42, C51, C52, C61, C62, C71, C72, . . . ) are (C11, C12, C21, C22, C31, C32, C41, C42, C52, C61, C62, C71, C72, . . . That is C51 is excluded from transmission and C52 directly follows C42 for transmission.

Basically, the puncturing matrix should meet the condition that the resulting high rate convolutional code is a non-catastrophic code and has a good weight spectrum.

The CDMA 2000 supplemental channel is punctured according to embodiments of the present invention as tabulated in table 1.

TABLE 1

Puncturing period = 9, original code rate R = ⅓, punctured code rate = ⅜

|  | current CDMA 2000 specification | proposed scheme |
|---|---|---|
| Puncturing matrix P | [111 111 110] | 1st embodiment<br>[011 111 111]<br>or<br>[111 011 111]<br>or<br>[111 111 011]<br><br>2nd embodiment<br>[101 111 111]<br>or<br>[111 101 111]<br>or<br>[111 111 101] |

In table 1, the first embodiment of the present invention proposes a puncturing pattern P={011 111 111}, {111 011 111}, or {111 111 011}. The second embodiment of the present invention proposes a puncturing pattern P={101 111 111}, {111 101 111}, or {111 111 101}.

Therefore, if three encoded symbols ($C_0$, $C_1$, $C_2$) for one input bit to a convolutional encoder forms a subgroup and three output subgroups for three successive input bits form a symbol group, the first symbol of one subgroup in each symbol group is punctured in the first embodiment of the present invention, and the second symbol of one subgroup in each symbol group is punctured in the second embodiment of the present invention.

Tables 2, 3, and 4 illustrate the weight spectra of convolutional codes generated from the conventional puncturing method and the puncturing methods according to the first and second embodiments of the present invention, respectively.

TABLE 2

| D = weight | Ad(d) | Cd(d) |
|---|---|---|
| 0 | 1.0000000000e+00 | 0.0000000000e+00 |
| 1 | 0.0000000000e+00 | 0.0000000000e+00 |
| 2 | 0.0000000000e+00 | 0.0000000000e+00 |
| 3 | 0.0000000000e+00 | 0.0000000000e+00 |
| 4 | 0.0000000000e+00 | 0.0000000000e+00 |
| 5 | 0.0000000000e+00 | 0.0000000000e+00 |
| 6 | 0.0000000000e+00 | 0.0000000000e+00 |
| 7 | 0.0000000000e+00 | 0.0000000000e+00 |
| 8 | 0.0000000000e+00 | 0.0000000000e+00 |
| 9 | 0.0000000000e+00 | 0.0000000000e+00 |
| 10 | 0.0000000000e+00 | 0.0000000000e+00 |
| 11 | 0.0000000000e+00 | 0.0000000000e+00 |
| 12 | 0.0000000000e+00 | 0.0000000000e+00 |
| 13 | 0.0000000000e+00 | 0.0000000000e+00 |
| 14 | 1.0000000000e+00 | 2.0000000000e+00 |
| 15 | 5.0000000000e+00 | 1.3000000000e+01 |
| 16 | 7.0000000000e+00 | 2.2000000000e+01 |

TABLE 2-continued

| D = weight | Ad(d) | Cd(d) |
|---|---|---|
| 17 | 1.2000000000e+01 | 5.2000000000e+01 |
| 18 | 2.7000000000e+01 | 1.3800000000e+02 |
| 19 | 7.1000000000e+01 | 4.3100000000e+02 |
| 20 | 9.2000000000e+01 | 5.9600000900e+02 |
| 21 | 1.3500000000e+02 | 9.2300000000e+02 |
| 22 | 2.7200000000e+02 | 1.9860000000e+03 |
| 23 | 4.9300000000e+02 | 3.9190000000e+03 |
| 24 | 9.6600000000e+02 | 8.2200000000e+03 |
| 25 | 1.7810000000e+03 | 1.6091900000e+04 |
| 26 | 3.2880000000e+03 | 3.1350000000e+04 |
| 27 | 6.0750000000e+03 | 6.1365000000e+04 |
| 28 | 1.1032000000e+04 | 1.1725800000e+05 |
| 29 | 2.0376000000e+04 | 2.2730800000e+05 |
| 30 | 3.7852000000e+04 | 4.4358000000e+05 |
| 31 | 6.9325000000e+04 | 8.4906500000e+05 |
| 32 | 1.2740200000e+05 | 1.6283820000e+06 |
| 33 | 2.3493700000e+05 | 3.1317010000e+06 |
| 34 | 4.3209200000e+05 | 5.9957060000e+06 |
| 35 | 7.9585500000e+05 | 1.1475875000e+07 |
| 36 | 1.4650500000e+06 | 2.1915126000e+07 |
| 37 | 2.6970500000e+06 | 4.1795710000e+07 |
| 38 | 4.9646360000e+06 | 7.9622180000e+07 |
| 39 | 9.1379150000e+06 | 1.5151910900e+08 |
| 40 | 1.6832243000e+07 | 2.8819174600e+08 |

TABLE 3

| D = weight | Ad(d) | Cd(d) |
|---|---|---|
| 0 | 1.0000000000e+00 | 0.0000000000e+00 |
| 1 | 0.0000000000e+00 | 0.0000000000e+00 |
| 2 | 0.0000000000e+00 | 0.0000000000e+00 |
| 3 | 0.0000000000e+00 | 0.0000000000e+00 |
| 4 | 0.0000000000e+00 | 0.0000000000e+00 |
| 5 | 0.0000000000e+00 | 0.0000000000e+00 |
| 6 | 0.0000000000e+00 | 0.0000000000e+00 |
| 7 | 0.0000000000e+00 | 0.0000000000e+00 |
| 8 | 0.0000000000e+00 | 0.0000000000e+00 |
| 9 | 0.0000000000e+00 | 0.0000000000e+00 |
| 10 | 0.0000000000e+00 | 0.0000000000e+00 |
| 11 | 0.0000000000e+00 | 0.0000000000e+00 |
| 12 | 0.0000000000e+00 | 0.0000000000e+00 |
| 13 | 0.0000000000e+00 | 0.0000000000e+00 |
| 14 | 0.0000000000e+00 | 0.0000000000e+00 |
| 15 | 5.0000000000e+00 | 1.3000000000e+01 |
| 16 | 9.0000000000e+00 | 2.4000000000e+01 |
| 17 | 1.2000000000e+01 | 5.4000000000e+01 |
| 18 | 2.6000000000e+01 | 1.3400000000e+02 |
| 19 | 5.3000000000e+01 | 2.9700000000e+02 |
| 20 | 7.8000000000e+01 | 5.0000000000e+02 |
| 21 | 1.5800000000e+02 | 1.0840000000e+03 |
| 22 | 2.5500000000e+02 | 1.8080000000e+03 |
| 23 | 4.5400000000e+02 | 3.5060000000e+03 |
| 24 | 9.0800000000e+02 | 7.5360000000e+03 |
| 25 | 1.6430000000e+03 | 1.4519000000e+04 |
| 26 | 3.0820000000e+03 | 2.8784000000e+04 |
| 27 | 5.6750000000e+03 | 5.6217000000e+04 |
| 28 | 1.0386000000e+04 | 1.0873200000e+05 |
| 29 | 1.9042000000e+04 | 2.0884600000e+05 |
| 30 | 3.5272000000e+04 | 4.0601600000e+05 |
| 31 | 6.4818000000e+04 | 7.8192400000e+05 |
| 32 | 1.1917900000e+05 | 1.5023480000e+06 |
| 33 | 2.1986400000e+05 | 2.8879020000e+06 |
| 34 | 4.0421100000e+05 | 5.5304640000e+06 |
| 35 | 7.4474500000e+05 | 1.0599293000e+07 |
| 36 | 1.3718750000e+06 | 2.0252904000e+07 |
| 37 | 2.5210150000e+06 | 3.8573481000e+07 |
| 38 | 4.6405860000e+06 | 7.3543646000e+07 |
| 39 | 8.5513410000e+06 | 1.4012966700e+08 |
| 40 | 1.5740063000e+07 | 2.6638336400e+08 |

TABLE 4

| D = weight | Ad(d) | Cd(d) |
|---|---|---|
| 0 | 1.0000000000e+00 | 0.0000000000e+00 |
| 1 | 0.0000000000e+00 | 0.0000000000e+00 |
| 2 | 0.0000000000e+00 | 0.0000000000e+00 |
| 3 | 0.0000000000e+00 | 0.0000000000e+00 |
| 4 | 0.0000000000e+00 | 0.0000000000e+00 |
| 5 | 0.0000000000e+00 | 0.0000000000e+00 |
| 6 | 0.0000000000e+00 | 0.0000000000e+00 |
| 7 | 0.0000000000e+00 | 0.0000000000e+00 |
| 8 | 0.0000000000e+00 | 0.0000000000e+00 |
| 9 | 0.0000000000e+00 | 0.0000000000e+00 |
| 10 | 0.0000000000e+00 | 0.0000000000e+00 |
| 11 | 0.0000000000e+00 | 0.0000000000e+00 |
| 12 | 0.0000000000e+00 | 0.0000000000e+00 |
| 13 | 0.0000000000e+00 | 0.0000000000e+00 |
| 14 | 1.0000000000e+00 | 3.0000000000e+00 |
| 15 | 3.0000000000e+00 | 6.0000000000e+00 |
| 16 | 9.0000000000e+00 | 2.3000000000e+01 |
| 17 | 8.0000000000e+00 | 3.0000000000e+01 |
| 18 | 2.4000000000e+01 | 1.1000000000e+02 |
| 19 | 5.2000000000e+01 | 2.6900000000e+02 |
| 20 | 7.6000000000e+01 | 4.8800000000e+02 |
| 21 | 1.5600000000e+02 | 1.0190000000e+03 |
| 22 | 2.5000000000e+02 | 1.7550000000e+03 |
| 23 | 4.1700000000e+02 | 3.1340000000e+03 |
| 24 | 8.4300000000e+02 | 6.7580000000e+03 |
| 25 | 1.5980000000e+03 | 1.3710000000e+04 |
| 26 | 2.8790000000e+03 | 2.6319000000e+04 |
| 27 | 5.2970000000e+03 | 5.1149000000e+04 |
| 28 | 9.5830000000e+03 | 9.7656000000e+04 |
| 29 | 1.7977000000e+04 | 1.9328600000e+05 |
| 30 | 3.3489000000e+04 | 3.7741300000e+05 |
| 31 | 6.1265000000e+04 | 7.2322500000e+05 |
| 32 | 1.1258300000e+05 | 1.3924300000e+06 |
| 33 | 2.0637800000e+05 | 2.6637450000e+06 |
| 34 | 3.8093700000e+05 | 5.1211750000e+06 |
| 35 | 7.0354500000e+05 | 9.8413150000e+06 |
| 36 | 1.2921330000e+06 | 1.8774266000e+07 |
| 37 | 2.3779390000e+06 | 3.5842127000e+07 |
| 38 | 4.3783250000e+06 | 6.8361110000e+07 |
| 39 | 8.0583950000e+06 | 1.3016359000e+08 |
| 40 | 1.4844576000e+07 | 2.4778565300e+08 |

Table 2 uses the conventional puncturing pattern P={111 111 110}. The puncturing pattern used in table 3 is P={011 111 111}, {111 011 111}, or {111 111 011}. Table 4 uses the puncturing pattern P={101 111 111}, {111 101 111}, or {111 111 101}. Ad(d) in each table denotes the number of paths with a Hamming weight D generated until they return to a correct path on a trellis after they deviate from the correct path due to errors. Cd(d) represents the sum of errors in all information bits caused by selection of an error path.

A minimum free distance (dfee) in table 2 is 14, whereas a dfee in table 3 is 15, which implies that the BER performance of a convolutional code generated from the puncturing technique according to the present invention is improved with a higher $E_b/N_o$ as an Ad(d) difference is constant, as compared to that of a convolutional code generated from the conventional puncturing technique. This is because a minimum weight path on a trellis causes all error events during convolutional decoding as $E_b/N_o$ increases. Therefore, as dfee increases, performance gain is generated at a higher $E_b/N_o$.

Figure 3:
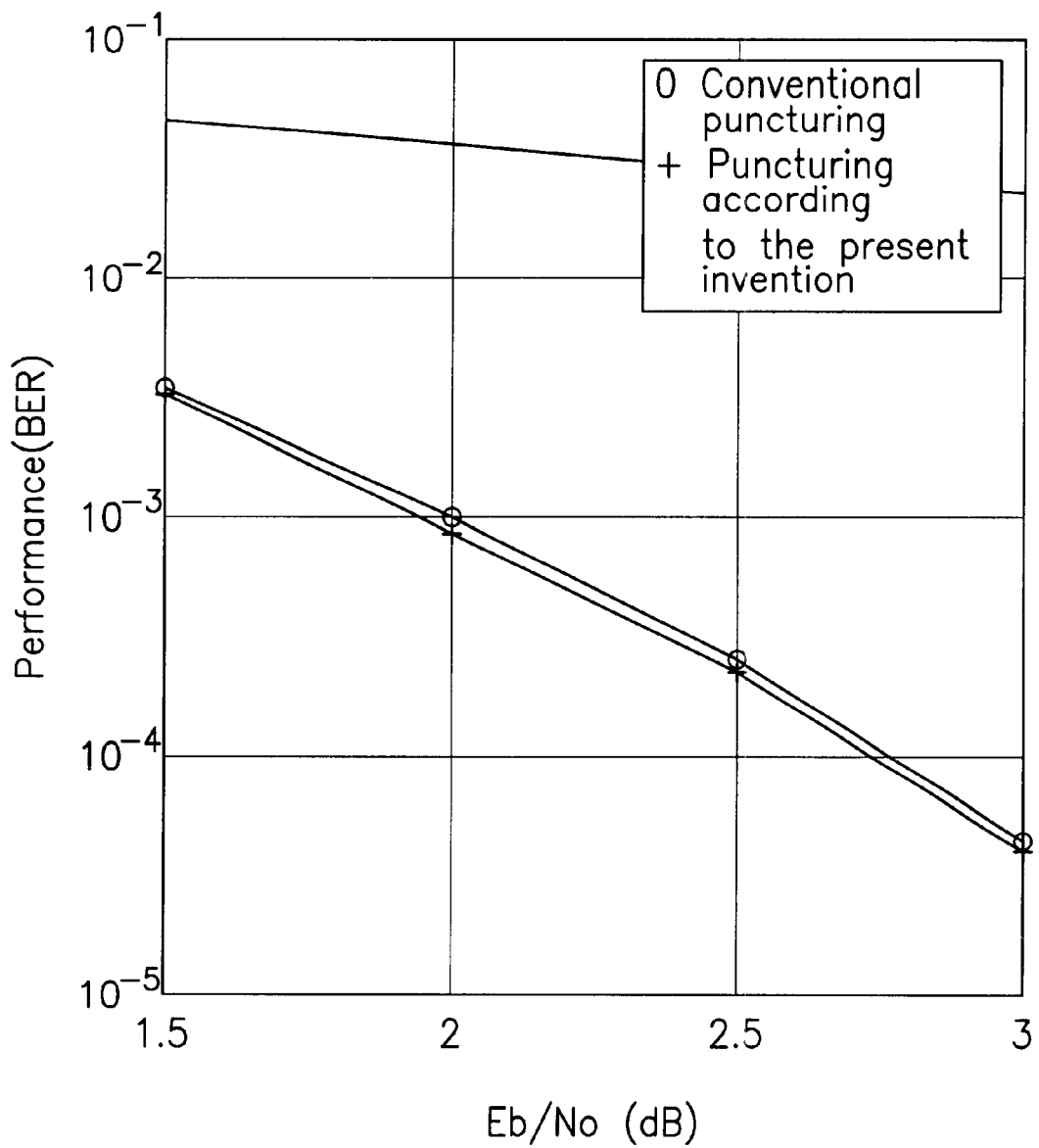
FIG. 3 is a graph comparing the bit error rate (BER) of a convolutional code according to a conventional puncturing pattern with the BER of a convolutional code according to a puncturing pattern for an AWGN (Additive White Gaussian Noise) channel according to the present invention in a forward supplemental channel transmitter.

Referring now to FIG. 3, there is shown a graph comparing BERs on an AWGN channel of a forward supplemental channel with R=⅜ according to the conventional puncturing pattern P={111 111 110} and a puncturing pattern of the present invention P={011 111 111}, {111 011 111}, or {111 111 011}.

In FIG. 3, a portion marked by "o" and a portion marked by "+" represent BERs according to the conventional puncturing and the puncturing of the present invention, respectively. As shown, a BER according to the puncturing of the present invention is less than a BER according to the conventional puncturing, with the same $E_b/E_o$ given.

As described above, a puncturing method for a convolutional encoder with k=9, R=⅓, and generator polynomials as shown in Eq. 1 according to the present invention offers the advantage of a lower BER as compared to the conventional puncturing method.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A convolutional encoding device in a digital system, comprising:
    a convolutional encoder for generating a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$, for inputting input bits to generate a symbol group of three subgroups for three successive input bits, and for generating a stream of the symbol groups; and
    a symbol puncturer for puncturing the first symbol of one of three subgroups in each symbol group generated from the convolutional encoder.

2. The convolutional encoding device of claim 1, wherein the puncturer outputs symbol groups in a puncturing matrix P where P has the form of P={011 111 111}, P={111 011 111}, or P={111 111 011} and where "1" represents symbol transmission and "0" represents symbol deletion.

3. A convolutional encoding device in a digital system, comprising:
    a convolutional encoder for generating a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$, for inputting input bits to generate a symbol group of three subgroups for three successive input bits, and for generating a stream of the symbol groups; and
    a symbol puncturer for puncturing the second symbol of one of three subgroups in each symbol group generated from the convolutional encoder.

4. The convolutional encoding device of claim 3, wherein the puncturer outputs symbol groups in a puncturing matrix P where P has the form of P={101 111 111}, P={111 101 111}, or P={111 111 101} and where "1" represents symbol transmission and "0" represents symbol deletion.

5. A convolutional encoding method in a digital system, comprising:
    generating a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$;
    inputting input bits to generate a symbol group of three subgroups for three successive input bits;
    generating a stream of the symbol groups; and
    puncturing the first symbol of one of three subgroups in each symbol group.

6. The convolutional encoding method of claim 5, wherein each symbol group is punctured in a puncturing matrix P where P has the form of P={011 111 111}, P={111 011 111}, or P={111 111 011} and where "1" of P represents symbol transmission and "0" represents symbol deletion.

7. A convolutional encoding method in a digital system, comprising:
    generating a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$;
    inputting input bits to generate a symbol group of three subgroups for three successive input bits;
    generating a stream of the symbol groups; and
    puncturing the first symbol of one of three subgroups in each symbol group.

8. The convolutional encoding method of claim 7, wherein each symbol group is punctured in a puncturing matrix P where P has the form of P={101 111 111}, P={111 101 111}, or P={111 111 101} and where "1" represents symbol transmission and "0" represents symbol deletion.

9. A forward supplemental channel transmitter in a CDMA 2000 system, comprising:
    a CRC (Cyclic Redundancy Check) generator for receiving a plurality of bits with different bit rates and adding corresponding CRC data to the received bits;
    a tail bit generator for adding corresponding tail bits to the output of the CRC generator;
    a convolutional encoder for generating a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$, for inputting input bits to generate a symbol group of three subgroups for three successive input bits, and for generating a stream of the symbol groups;
    a symbol puncturer for puncturing the first symbol of one of three subgroups in each symbol group generated from the convolutional encoder; and
    a block interleaver for block-interleaving the output of the puncturer.

10. The forward supplemental channel transmitter of claim 9, wherein the puncturer outputs symbol groups in a puncturing matrix P where P has the form of P={011 111 111}, P={111 011 111}, or P={111 111 011} and where "1" represents symbol transmission and "0" represents symbol deletion.

11. A forward supplemental channel transmitter in a CDMA 2000 system, comprising:
    a CRC generator for receiving a plurality of bits with different bit rates and adding corresponding CRC data to the received bits;
    a tail bit generator for adding corresponding tail bits to the output of the CRC generator; a convolutional encoder for generating a subgroup of a first, a second and a third encoded symbols for each input bit using generator polynomials including $g_0(x)=1+x^2+x^3+x^5+x^6+x^7+x^8$, $g_1(x)=1+x+x^3+x^4+x^7+x^8$, and $g_2(x)=1+x+x^2+x^5+x^8$, for inputting input bits to generate a symbol group of three subgroups for three successive input bits, and for generating a stream of the symbol groups;
    a symbol puncturer for puncturing the second symbol of one of three subgroups in each symbol group generated from the convolutional encoder; and
    a block interleaver for block-interleaving the output of the puncturer.

12. The forward supplemental channel transmitter of claim 11, wherein the puncturer outputs symbol groups in a puncturing matrix P where P has the form of P={101 111 111}, P={111 101 111}, or P={111 111 101} and where "1" represents symbol transmission and "0" represents symbol deletion.

* * * * *